United States Patent
Edwards et al.

(10) Patent No.: US 6,436,223 B1
(45) Date of Patent: Aug. 20, 2002

(54) PROCESS AND APPARATUS FOR IMPROVED MODULE ASSEMBLY USING SHAPE MEMORY ALLOY SPRINGS

(75) Inventors: David L. Edwards, Poughkeepsie; Enrique C. Abreu, Wappingers Falls; Ronald L. Hering, Pleasant Valley; David C. Olson, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/250,312

(22) Filed: Feb. 16, 1999

(51) Int. Cl.⁷ .............................................. B32B 31/00
(52) U.S. Cl. ..................... 156/288; 148/402; 148/908; 29/281.5; 156/311; 156/312; 156/325; 156/381; 269/903
(58) Field of Search ................................ 156/312, 381, 156/288, 311, 325; 29/281.5; 269/903; 148/402, 908

(56) References Cited

U.S. PATENT DOCUMENTS

| 3,262,694 A | * | 7/1966 | O'Farrell ..................... 269/903 |
| 4,497,241 A | | 2/1985 | Ohkata |
| 4,635,610 A | | 1/1987 | Nakanishi |
| 4,687,315 A | | 8/1987 | Fujii |
| 4,801,279 A | | 1/1989 | Nakanishi |
| 4,839,486 A | | 6/1989 | Tanigawa |
| 4,849,032 A | * | 7/1989 | Kawaguchi .................. 148/402 |
| 4,897,006 A | * | 1/1990 | Blin ............................ 411/368 |
| 4,984,542 A | | 1/1991 | Rische et al. |
| 5,226,979 A | * | 7/1993 | Thoma ......................... 148/402 |
| 5,277,028 A | | 1/1994 | Worner et al. |
| 5,393,221 A | | 2/1995 | McNally |
| 5,447,125 A | | 9/1995 | McNally et al. |
| 5,465,470 A | * | 11/1995 | Vongfuangfoo et al. ... 29/281.5 |

* cited by examiner

Primary Examiner—John J. Gallagher
(74) Attorney, Agent, or Firm—RatnerPrestia; Ira D. Blecker, Esq.

(57) ABSTRACT

A fixture and process for assembly of semiconductor modules. Each module comprises a substrate and a cover attached to the substrate. The fixture comprises a baseplate adapted to accept the substrate and a spring-loading device containing a shape memory alloy spring engaging the cover. The shape memory alloy spring exerts a lesser force at room temperature and an elevated force at the bonding temperature of the bonding agent used to attach the cover to the substrate. The process comprises the steps of (a) loading she module into an assembly fixture and aligning a shape memory alloy spring over the module at room temperature; (b) placing the fixture and module into a heating chamber; (c) heating the fixture and module to a temperature sufficient for bonding and above the shape memory alloy spring transition temperature range so that the spring exerts an elevated force on the module; and (d) cooping the fixture and module below the transition temperature so that the spring exerts a lesser amount of force on the module, and disengaging the springs at the lower temperature.

18 Claims, 4 Drawing Sheets

PROCESS AND APPARATUS FOR IMPROVED MODULE ASSEMBLY USING SHAPE MEMORY ALLOY SPRINGS

TECHNICAL FIELD

The present invention relates to a process and apparatus for assembly of semiconductor modules and, more specifically, to a process and related apparatus for clamping a cover to a substrate of a semiconductor module during a bonding process.

BACKGROUND OF THE INVENTION

Semiconductor modules, including single chip modules (SCM) and multi-chip modules (MCM), are used in a number of applications. Such modules generally comprise a substrate, a chip mounted on the substrate, and a lid or cover over the chip or chips. The cover is usually attached to the substrate using an adhesive that is heat-cured or a solder that is reflowed.

The lid or cover may have multiple purposes. It may provide mechanical protection of the device from handling and assembly tooling. It may also enhance heat transfer, especially for flip chip packages, where thermal passes are typically used to thermally connect the back side of the chip or chips to the inner or lower surface of the lid or cover.

When the lid or cover is sealed to the substrate, it also provides environmental protection of the devices from chemicals and moisture. When thermal pastes are used to cool flip chips, the seal typically prevents premature drying of the paste. Although some sealed packages must be hermetic, most only need to pass a bubble leak test. Industry competition demands low cost, high volume, and high-yield assembly of such modules.

Stamped fixtures, typically of stainless steel, such as "Auer Boats" manufactured by AUER Precision Company, Inc. of Mesa, Ariz., are prevalent in the industry as fixtures used for such assembly. Referring now to FIG. 1, there is shown the configuration of a typical stamped stainless steel fixture 90 of the prior art for assembly of semiconductor package or module 95. A typical module 95 consists of a substrate 100 and cover 102, the substrate 100 having mounted upon it an integrated circuit chip 104 and having pins 106 extending from the bottom of the substrate 100.

To assemble module 95, substrate 100 with one or more attached chips 104 is set in a baseplate 110 aligned by alignment features or guides 111. An alignment plate 112 is aligned to baseplate 110 using alignment pins 114 attached to the alignment plate 112, each alignment pin 114 comprising a spacer portion 116 and a pin portion 118 adapted to fit in hole 119 in baseplate 110. Substrate 100 and chip 104 are typically prepared with chip underfill (not shown) applied around and wicking under chip 104, thermally conductive paste (not shown) applied on top of chip 104, and seal adhesive (not shown) placed on the surface of substrate 100 where cover 102 will contact the substrate 100. Solder may also be used in place of seal adhesive.

The underfill protects the interface between the chip 104 and substrate 100 and prevents oxidation of the solder balls 103 used to attach the chip 104 to the substrate 100. The thermally conductive paste creates a conductive pathway from the top of the chip 104 to the cover 102, so that heat may be dissipated away from the chip 104 through the cover 102. Finally, the seal adhesive or the solder bonds around the perimeter of the cover 102, sealing the area inside the cover 102 to protect it from oxidation and to prevent paste drying. Cover 102 is then placed on top of substrate 100 so prepared.

Pressure is then applied to press substrate 100 against cover 102, using a clip 120. Clip 120 consists of a bridge 122 having tabs 124 punched through the bridge 122, and prongs 126 attached at both ends of bridge 122. Each prong 126 has an upper stop tab 128, a lower stop tab 130, and an angled end 132. Tabs 124 are spaced to hold the ends of a leaf spring 134 between them. The compression force, usually between 2 to 10 pounds, imparted by the spring 134 "squishes" the paste layer on top of the chip 104 to conform it to the space between the chip 104 and the cover 102, has assuring a good conductive connection and cover seal. The force of the spring 134 also seats the cover 102 on the substrate 100, thinning the adhesive, before the cure step.

The clip 120 is inserted manually by squeezing the prongs 126 slightly toward one another and inserting them through alignment plate holes 136 and baseplate holes 138, thus compressing spring 134. Once the lower stop tabs 130 have completely penetrated baseplate holes 138, the prongs 126 are allowed to spring back away from one another, and the lower stop tabs 130 hold the prongs 126 into place to prevent the force of compressed spring 134 from retracting the clip 120. Upper stop tabs 128 prevent the prongs 126 from being inserted too far into baseplate holes 138.

A semiconductor module 95 so assembled is then put in an oven or furnace to heat cure the seal adhesive or to reflow the solder to create a strong bond and seal between cover 102 and substrate 100. A typical stamped stainless steel fixture 90 might accommodate anywhere from one to ten such modules 95, and typically five modules 95 on a single baseplate 110 with a single corresponding alignment plate 112. Other module-assembly fixtures have been developed, however, as detailed further in the description of the invention.

In any such assembly fixture, the force of the spring that compressively holds the cover against the substrate during the adhesive curing or solder reflow step is an important factor in producing an acceptable quality seal between the cover and substrate for modules produced In that fixture. Generally, the higher the spring force, within the force tolerances of the module and fixture components, the better the yield of acceptable quality modules.

Despite the yield advantage of using springs having a higher resistive force to deflection, such springs are more difficult for process operators to use. Special tooling may be required to open and close fixtures using multiple, high-force springs. In addition, certain module designs, such as modules having column grid array (CGA) input/output (I/O) connections, may be easily damaged by using springs having higher resistive forces. Thus, a need exists for fixtures incorporating springs that provide easy manipulation by operators when loading a fixture, but enable high forces during bonding for Improved product yield.

SUMMARY OF THE INVENTION

To meet this and other needs, and in view of its purposes, the present invention provides a fixture for assembly of a semiconductor module comprising a substrate and a cover on the substrate. The fixture comprises a baseplate having alignment features, adapted to accept the substrate, and a spring-loading device. The spring-loaded device is mounted over the baseplate and has a shape memory alloy spring engaging the cover.

The shape memory alloy spring may have a lesser force below a transition temperature range, and a higher force above the transition temperature range. The transition temperature range may be above room temperature and below the bonding temperature of a bonding agent, such as solder or an adhesive, that is used to attach the cover to the substrate.

The present invention further comprises a process for assembling a semiconductor module having a substrate and a cover attached with a bonding agent, the process comprising the steps of:

a) loading the semiconductor module into an assembly fixture and aligning a shape memory alloy spring over the module at room temperature;

b) placing the fixture and module into a heating chamber;

c) heating for a designated period of time the fixture and module in the heating chamber at a temperature sufficient to bond the bonding agent and that is above a transition temperature of the shape memory alloy spring so that the spring exerts an elevated force on the module; and d) cooling the fixture and module to a lower temperature below the transition temperature so that the spring exerts a lesser force on the module, and disengaging the spring at the lower temperature.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
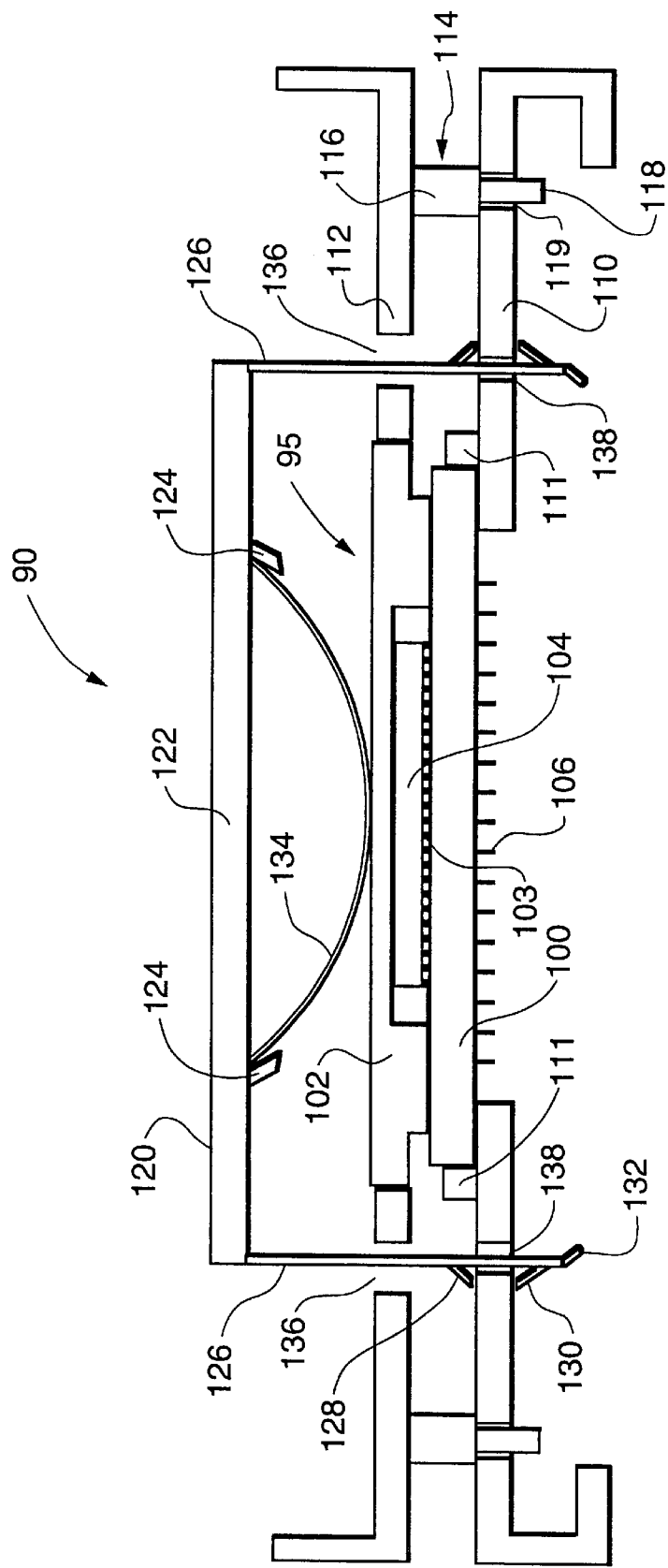
FIG. 1 is a cross-sectional illustration of a typical fixture of the prior art.
Figure 2:
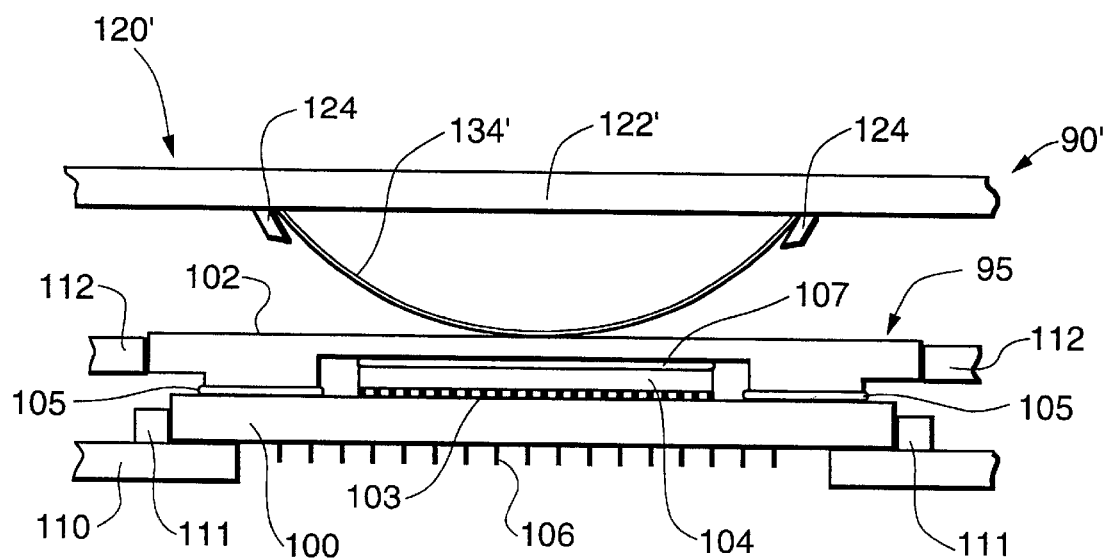
FIG. 2 is a cross-sectional illustration of a fixture of the present invention comprising a Leaf spring.
Figure 3:
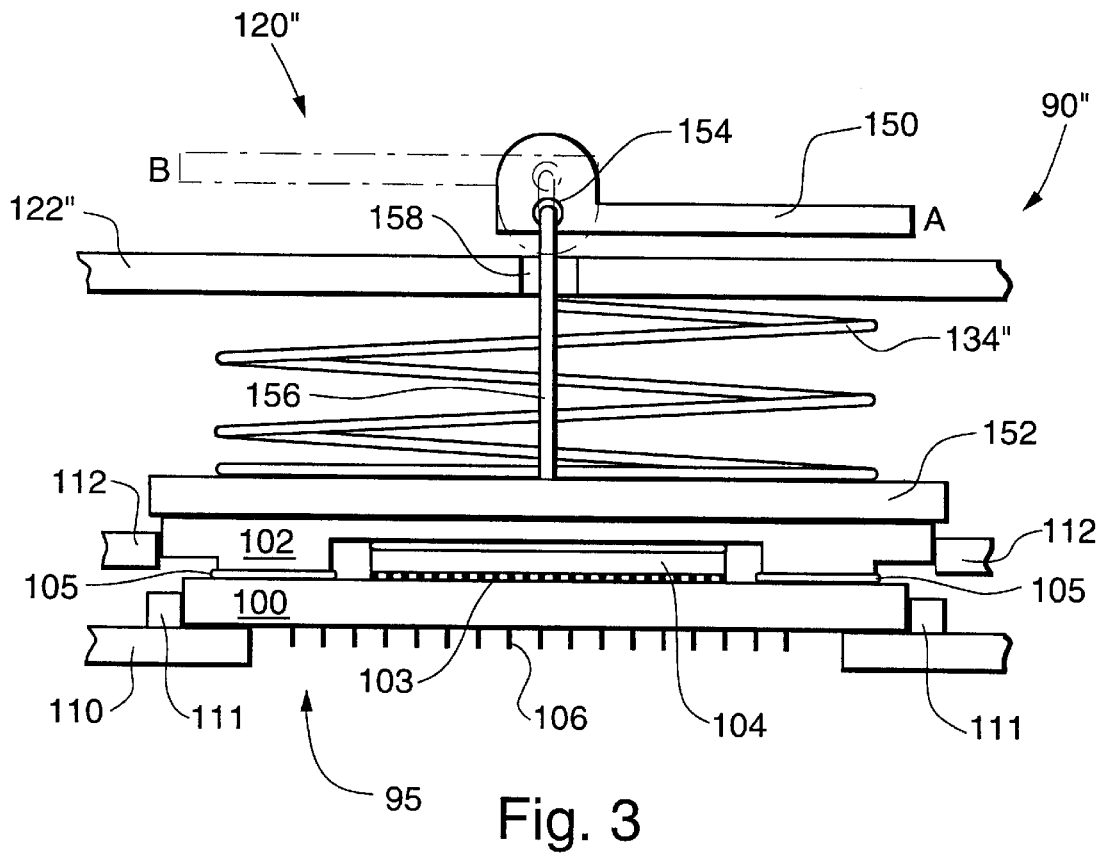
FIG. 3 is a cross-sectional illustration of a fixture of the present invention comprising a coil spring.

Referring now to the drawing, wherein Like reference numerals refer to like elements throughout, FIGS. 2 and 3 show cross-sectional illustrations of exemplary module assembly fixtures of the present invention. FIGS. 2 and 3 each show a portion of fixtures 90' and 90" that are similar to fixture 90 of the prior art, as shown in FIG. 1, except that fixtures 90' and 90" each have shape memory alloy springs. Fixture 90' contains a leaf spring 134' and fixture 90" contains a coil spring 134".

In accordance with the present invention, fixtures 90' and 90" each comprise a baseplate 110 having alignment features or guides 111 adapted to accept module substrate 100 and a spring-loading device 120' or 120". Spring-loading device 120' or 120" further comprises a shape memory alloy (SMA) spring 134' or 134" engaging the module cover 102. Fixtures 90' and 90" may optionally further include an alignment plate 112 adapted to align module cover 102 over the substrate 100. Some cover designs, such as what is known in the art as a "corner cap," may be self-aligning, however, eliminating the need for an alignment plate 112.

Shape memory alloys have a unique characteristic: they have a "memory." Above a certain transition temperature, shape memory alloys try to return to a predetermined shape. The transition temperature is dependent on the material; therefore, the transition temperature of a SMA spring 134' or 134" depends on the material used in the spring. Below the transition temperature, the SMA spring 134' or 134" may deform with very little applied force. Above the transition temperature, the SMA spring 134' or 134" tries to return to its memory shape. If unconstrained, the SMA spring 134' or 134" merely attains the memory shape, but if constrained, the SMA spring 134' or 134" exerts an elevated load on whatever prevents it from returning to the memory shape. The process is reversible and repeatable many times. Shape memory alloys are commercially available and can be custom-made to unique shapes with a wide range of prescribed transition temperatures.

Shape memory alloys have been used, for instance, for air-temperature-sensitive louvers in air-conditioning systems, for oven damper controls, for throttle actuators, for washers that can temperature-adjust the tension on a bolt, and the like. Shape memory alloy springs are commercially available. For example, shape memory springs made of an alloy of nickel and titanium can be purchased from Shape Memory Applications Inc. of Santa Clara, Calif.

For the present invention, substrate 100 and cover 102 are typically attached together with a bonding agent 105, such as an adhesive or a solder, having a bonding temperature (the cure temperature for an adhesive or the reflow temperature for solder). A high-conductivity thermal paste 107 may also be applied between chip 104 and cover 102 to conduct heat from the chip 104 to the cover 102. The cover 102 then dissipates the heat. In the alternative, modules 95 may be manufactured using direct lid attach (DLA) technology, in which cover (or lid) 102 attaches directly to chip 104 with bonding agent 105, but without any sea between substrate 100 and lid 102.

The SMA spring 134' or 134" is chosen so that it has a transition temperature range above room temperature and below the bonding temperature, and so that the resistive load below the transition range is lower than the resistive load above the transition range. Preferably, the resistive load below the transition range is low enough that the spring 134' or 134" may be easily deformed by hand, yet high enough to hold components of the module 95 within the fixture 90' or 90". Optimally, the resistive load above the transition range is high enough to promote high product yield, but not high enough to damage components of the module 95 or fixture 90' or 90".

Because adhesive bonding agents may begin to significantly set before they reach their cure temperature, the transition temperature range preferably begins just above room temperature, such as in the range of about 30°–40° C., so that the elevated force of the SMA spring 134' or 134" is activated before the adhesive begins to significantly set. In this way, assembly and disassembly may always be performed with the lowest resisting forces. Very early in the heat-up cycle, however, the springs 134' or 134" pass through the transition temperature and then apply the elevated load for nearly the entire thermal cycle of the bonding process. This allows the maximum load to be applied to thin out the adhesive to the desired thickness between substrate 100 and cover 102 before the adhesive sets.

For instance, a typical silicone elastomer used to attach cover 102 to substrate 100 may have a cure temperature of 150° C. and a gel temperature of 65° C. In the case of adhesives having multiple temperature regions, partial setting may occur at a lower temperature than the cure temperature. For such cases, the transition temperature is preferably below the lowest temperature at which even partial setting begins.

Unlike an adhesive, solder bonding agents do not risk partial setting. Therefore, the transition range of solder bonding agents need not begin at as low a temperature. With solder, the preferable transition temperature range is at least about 10° C. above room temperature and at least about 10° C. below the solder reflow temperature.

As shown in FIGS. 2 and 3, baseplate 110 supports and aligns module 95, which generally comprises substrate 100, chip 104 on substrate 100, and cover 102 bonded to the substrate 100 with bonding agent 105 between cover 102 and substrate 100. Substrate 100 may have multiple devices attached to its surfaces, such as at least one chip 104, resistors (not shown), and capacitors (not shown). The chips 104 may be electrically and mechanically connected to the substrate 100, for example, by solder balls 103 for chip 104 or wire bonded (not shown). Cover 102 may be metal, ceramic, plastic, or any other material conventionally used for module lids or covers.

Adhesive or bonding agent 105 for attaching cover 102 to substrate 100 is typically solder, epoxy, or an elastomer. For each of these material types, elevated temperatures are needed to complete the bond. For solder, elevated temperatures allow the solder to reflow and attach substrate 100 to cover 102. For epoxies and elastomers, elevated temperatures cause the material to set and cure. When a seal is desired, each assembled module may be leak tested after cooling and after the spring loading portion of the fixture is removed.

Substrate 100 may be ceramic, plastic, or some other conventional module material known in the art. Baseplate 110 is typically made of metal or high-temperature plastic. Baseplate 110 must handle the applied spring load during assembly and be thermally and mechanically stable during the thermal cycle of the module assembly process.

Cover 102, which may also be referred to as a lid or a cap, is positioned over chip 104 by alignment plate 112. As shown in FIG. 2, a shape memory alloy leaf spring 134' is constrained at each end by tabs 124 and is sandwiched between cover 102 and clip or spring-loading device 120'. Although spring loading device 120' may be a clip, such as clip 120 shown in FIG. 1 having bridge 122, it may comprise some other carrying frame 122'. The spring-loading device 120' and the baseplate 110 are mechanically connected so that SMA spring 134' remains compressed before and during the thermal process of attaching the cover 102 to the substrate 100.

As shown in FIG. 3, instead of a SMA leaf spring 134', a SMA coil spring 134" may be used to provide the compressive force needed to hold the cover 102 to the substrate 100 during the attachment process. Spring-loading device 120" is specifically adapted for use with SMA coil spring 134", and may include a cam actuator 150 attached to a plunger 152 by a tension element 156 that extends through a hole 158. SMA coil spring 134" is interposed between plunger 152 and carrying frame 122".

With cam actuator 150 in position "A", the SMA coil spring 134" can more fully extend, whereas in position "B", the SMA coil spring 134" is retracted for easier loading of the module 95. Eccentric aperture 154, located in cam actuator 150, receives tension element 156. Eccentric aperture 154 is located off-center such that the distance between aperture 154 and carrying frame 122" is shorter when cam actuator 150 is in position "A" than when in position "B."

Such a cam actuator 150 is advantageous when used with fixtures 90 of the prior art in which the springs 134 may have a constantly elevated resistive force. Thus, an operator may put cam actuator 150 in position "B" while loading modules 95, and then put the cam actuator 150 in position "A" before curing the adhesive. In such a way, the operator does not encounter the elevated resistive force of SMA coil spring 134" when loading the fixture, because the spring load is carried by tension element 156 rather than pressing against module 95.

Although such a cam mechanism 150 may be used with the present invention, it may be unnecessary because the use of a shape memory alloy in SMA coil spring 134" gives the spring variable resistive forces. With a shape memory alloy spring, the spring itself may be designed so that it only exhibits a light resistive force at room temperature when loading the modules, and an elevated resistive force when at the cure temperature. In such case, SMA coil spring 134" may be attached directly to the carrying frame 122" by any process known in the art, such as, for instance, attaching tension element 156 to a fixed structure (no shown) rather than movable cam actuator 150. The elimination of removable or more complex components. such as cam actuator 150 from module assembly fixtures may increase the life of the fixtures by reducing wear related to the moving or complex parts.

To maximize the life of the fixtures, each of the fixture components must be chemically, thermally, and mechanically stable. By design, however, shape memory alloy springs 134' or 134" are the only fixture elements that are not thermally and mechanically stable. Their instability provides important utility in the present invention.

The size of the pocket created by alignment features ill to accept and align substrate 100 is generally as small as possible to maximize alignment, but large enough to accept the largest substrate allowed by the substrate size specification. Baseplate 110 often has a through-hole underneath substrate 100 to allow room for any protruding electrical input/output (I/O) pins 106, such as the pins of a PGA (pin grid array), BGA (ball grid array), or CGA (column grid array), attached to the bottom of substrate 100. No through-hole is necessary for use with an LGA (land grid array) because of the insignificant height of its I/O connections.

For some fixtures, spreader plates (not shown) may be used between cover 102 and spring 134' or plunger 152. Such a spreader plate may prevent scratching of the back of the cover 102, may more evenly distribute the applied spring load, or may otherwise redistribute the applied load.

Shape memory allow springs generally can be made from a variety of materials and thicknesses to accommodate existing conventional fixtures. Alternatively, new fixtures may be designed specifically for use with shape memory alloy springs. The choice of springs for a specific application may depend upon the resistive load-to-deformation above and below the transition temperature and upon the upper and lower temperatures of the transition temperature range.

Figure 4:
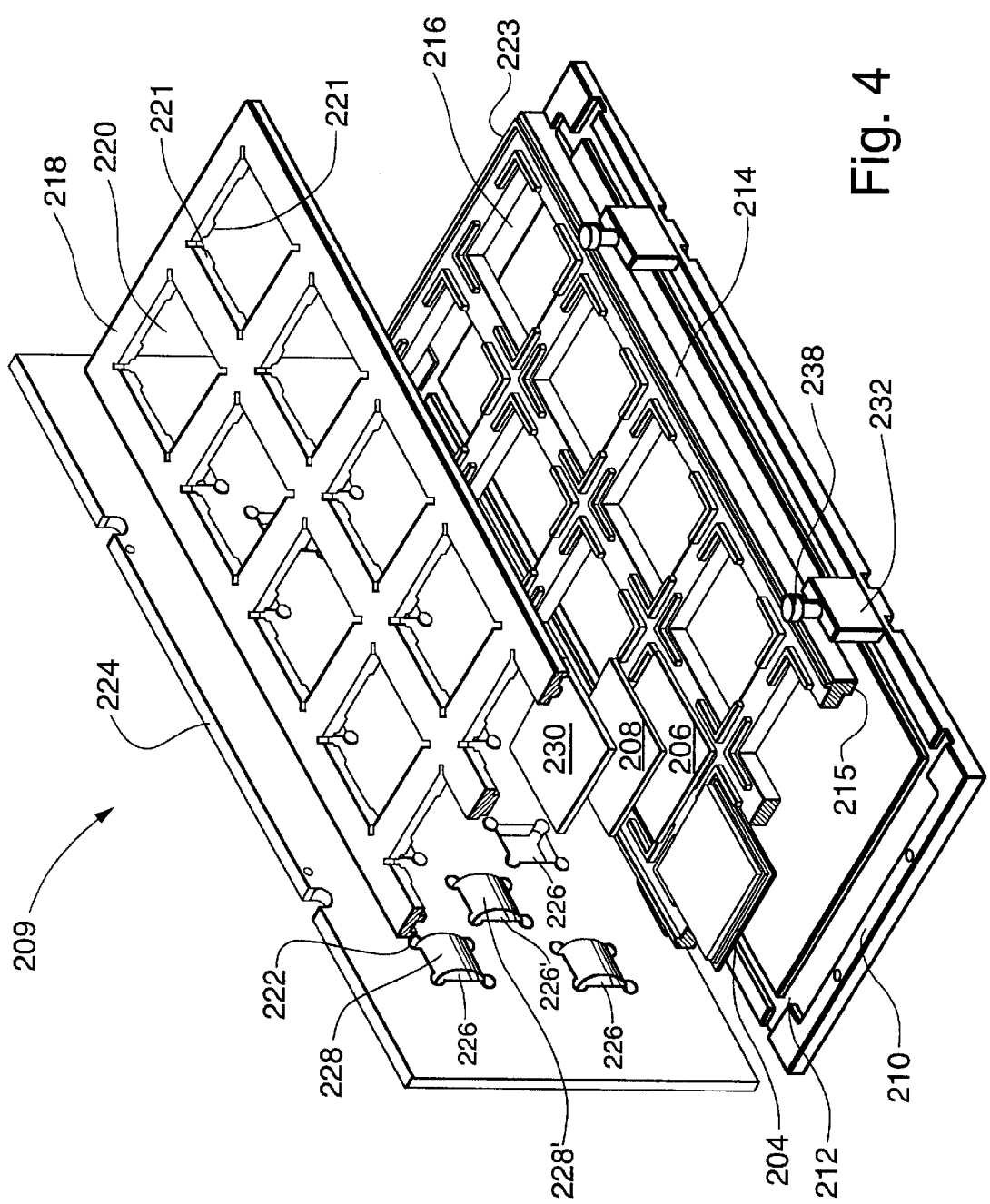
FIG. 4 is a top view illustration of a fixture for assembly of multiple modules, adapted to incorporate shape memory springs in accordance with the present invention.

Referring next to FIG. 4, there is shown an embodiment of the present invention used for manufacture of a plurality of semiconductor modules 204, as described in U.S. patent application Ser. No. 09/041,459, assigned to the common assignee of this invention and incorporated by reference. Fixture 209 for assembling these modules 204 consists of a baseplate 210, preferably constructed of 6.4 mm (one-quarter inch) thick aluminum having a perimeter slot 212 milled in it. A tray 214 fits onto baseplate 210, its precise location being directed by aligning bottom ridge 215 into slot 212. Tray 214 is preferably a "JEDEC tray"; such a tray conforms to the Tray Standard of the Joint Electronic Device Engineering Council (JEDEC). Tray 214 has a plurality of cavities 216, in the illustrated case ten such cavities, each adapted to fit a substrate 206.

Alignment plate 218 fits on top of tray 214. Alignment plate 218 also has a plurality of openings 220, in the illustrated case ten such openings, each opening 220 having an associated plurality of fingers 221. Each opening 220 is adapted to receive cover 208 and each associated plurality of fingers 221 is adapted to accept a substrate 206, thus precisely aligning each cover 208 over its respective substrate 206 within tight tolerances, if necessary. In a preferred embodiment, alignment plate 218 also has a bottom lip 222 along its perimeter that fits together with top ridge 223 of tray 214, thus locating the alignment plate 218 in relation to tray 214.

A compression plate 224 pivotably attaches to baseplate 210, preferably with a hinge (not shown). Compression plate 224 has a plurality of receptacles 226, each adapted to fit a leaf spring 228. A spreader plate 230 stacks on top of each assembled module 204, on top of cover 208. Although the embodiment shown uses leaf springs, and leaf springs are preferred, other springs such as coil springs can be used.

Each module assembly has an individual spreader plate 230, with an individual spring 228 placed on top of it, in a preferred embodiment. Nevertheless, a single spreader plate 230 can be used having multiple contacts, each contact uniformly distributing compressive force to a module assembly. Such a configuration can use less than one spring for every module, or even a single spring for the single spreader plate. A variation of this configuration includes more than one spreader plate but fewer than one per each module, each plate distributing the force of one or more springs on more than one module, thus presenting numerous combinations of spreader plates and springs, all encompassed by the present invention.

In either the multi-contact spreader plate configuration or in the configuration having an individual spreader plate for each module, each spring may be attached to the spreader plate rather than to the compression plate, so long as the spring is interposed between the compression plate and the spreader plate. The spreader plates may be excluded altogether, and each spring may directly contact each module assembly. In a preferred embodiment, however, the spreader plate is used—especially for thin cover constructions that potentially could be deformed by direct contact with the spring.

Compression plate 224 and baseplate 210 are hinged together in the shape of a book. When the hinged compression plate 224 is closed like the cover of a closed book, the springs 228 compress against spreader plates 230 and compress together cover 208 and substrate 206. The compression plate 224 is prevented from closing too tightly by stops 232. Once the fixture 209 is closed, a latch assembly, comprising a latch gate (not shown) on top of compression plate 224 and a latch pin 238, may prevent the fixture 209 from re-opening.

In a preferred embodiment, compression plate 224 also includes one or more additional receptacles 226', each adapted to contain a leaf spring 228'. The location of the leaf spring 228' is such that when the compression plate 224 closes, the spring 228' presses against alignment plate 218 rather than a spreader plate 230, thus holding the alignment plate 218 In place when the fixture 209 is closed. In a preferred embodiment, the configuration of receptacle 226' is identical to receptacles 226. Similarly, the properties of spring 228' are identical to the properties of springs 228. In an alternate embodiment, however, the springs 228' and corresponding receptacles 226' may be different than the combination used for compressing the modules 204.

Springs 228 and 228' are preferably detachable from receptacles 226 and 226', respectively, so that springs of differing compressive forces may be used for assembly of modules 204 having differing compressive requirements or differing thicknesses. In accordance with the present invention, springs 228 and 228' are shape memory springs. Using shape memory springs with fixture 209 allows closure of compress-on plate 224 onto baseplate 110 with relative ease at room temperature, given the ten to twelve springs opposing closure. Upon heating fixture 209 and modules 204 above the transition temperature of springs 228 and 228', the springs each then begin exerting an elevated force.

Figure 5:
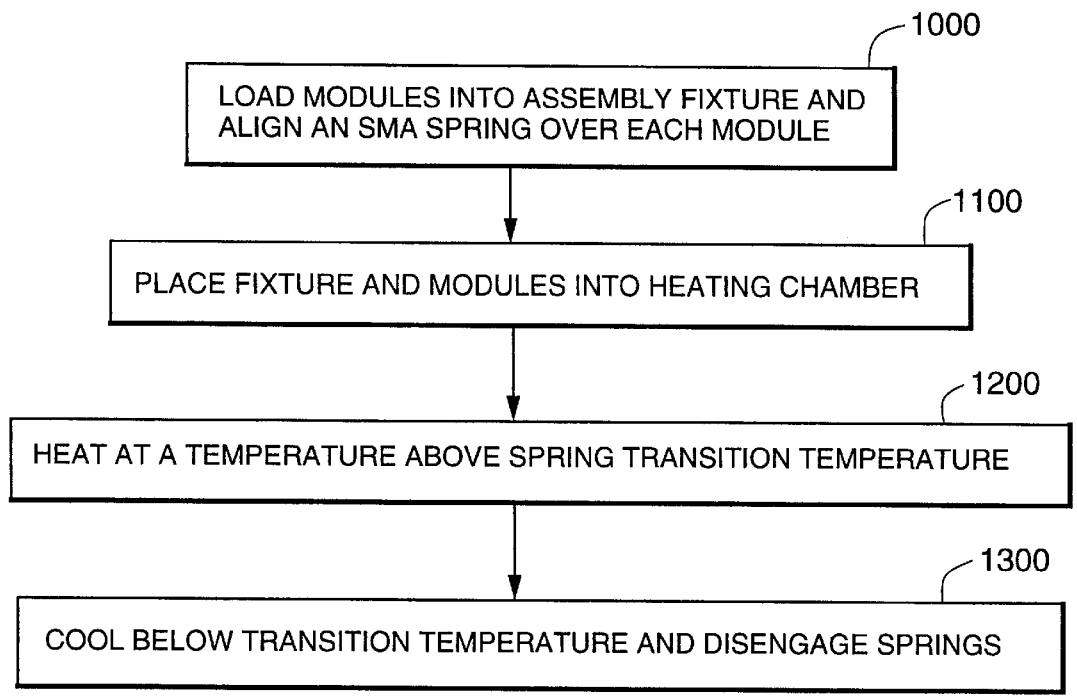
FIG. 5 is a flowchart depicting a process for using the fixture of the present invention.

Referring now to FIG. 5, there is shown a flowchart depicting the process of assembling modules according to the present invention. The process comprises the steps of:

a) at step 1000, at room temperature, loading one or more modules 95 into assembly fixture 90', 90", or 209 and aligning a shape memory alloy spring 134', 134", or 228 over each module 95, as shown in FIGS. 2, 3, or 4, respectively;

b) at step 1100, placing fixture 90', 90", or 209 and the module or modules 95 into a heating chamber;

c) at step 1200, heating fixture 90', 90", or 209 and the module or modules 95 for a designated period of time in the heating chamber at a temperature that is sufficient for bonding of bonding agent 105 between cover 102 and substrate 100 and that is above the transition temperature of each shape memory alloy spring 134', 134", or 228, so that he spring exerts an elevated force on the module; and d) at step 1300, cooling fixture 90', 90", or 209 and module or modules 95 to a lower temperature that is below the transition temperature, so that each spring 134', 134", or 228 exerts a lesser amount of force on the module, and disengaging each spring at the lower temperature.

Preferably, heating step (c) comprises reaching the transition temperature such that the spring exerts the elevated force before the bonding substance significantly sets.

Disengaging each spring 134' or 134" in step 1300 of FIG. 5 may comprise removing the spring and the associated spring-loading device 120' or 120" from the fixture 90' or 90". Module or modules 95 may then be left in the fixture for continued use of the fixture as a carrier for future process steps, or the module or modules may be removed. In the alternative, as with fixture 209 as shown in FIG. 4, modules 204 may be left in the JEDEC tray 214 and the entire tray removed for future processing. In this case, springs 228 remain in receptacles 226 in compression plate 224 and the step 1300 of FIG. 5 of disengaging the springs merely comprises opening book fixture 209.

EXAMPLE

The following example is included to more clearly demonstrate the overall nature of the invention. This example is exemplary, not restrictive, of the invention.

Figure 6:
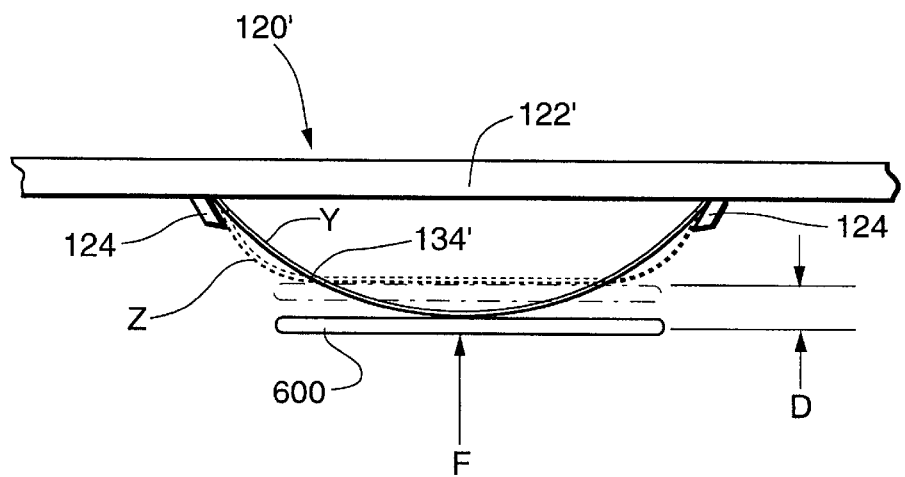
FIG. 6 is a cross-sectional illustration of a portion of the fixture of FIG. 2, showing spring deflection.

A clip, such as clip 120' of fixture 90' as shown in FIG. 2, was outfitted with a shape memory alloy leaf spring 134' having a composition of Nickel-Titanium alloy and a transition temperature of 90° C. Referring now to FIG. 6, there is shown a portion of clip 120' having tabs 124 with spring 134' mounted against tabs 124. Spring 134' measured 35.6 mm (1.4 inches) long, 17.8 mm (0.7 inches) wide, and 3 mm (0.12 inches) thick when flat, and in use was buckled by being constrained between tabs 124 that were 23.9 mm (0.94 inches) apart, as shown in FIG. 6. A spring tester (not shown), such as a compression spring tester, having a plate 600, was used to deflect spring 134' from uncompressed position "Y" to compressed position "Z" while measuring the associated force "F" required to produce the deflection.

Several different tests compressing spring 134' to different heights were performed, producing deflections "D" of varying amounts according to the table below. The force F required to compress the spring 134' at room temperature as measured with the spring tester is listed as the Assembly Force. The spring 134' was then heated in an oven above the spring transition temperature, and the force required to maintain deflection "D" was again measured to provide the Heated Force. After allowing the fixture and modules to cool, the Disassembly Force—the spring force below the transition temperature after the heating cycle—was measured. Table 1 shows the change in force associated with the change in temperature:

TABLE 1

| Deflection mm (inches) | Assembly Force (pounds) | Heated Force (pounds) | Disassembly Force (pounds) |
| --- | --- | --- | --- |
| 0.5 (0.02) | 1.5 | 7.5 | 0 |
| 1.0 (0.04) | 5 | 12 | 0 |
| 1.5 (0.06) | 7 | 15.5 | 0 |
| 2.0 (0.08) | 10.5 | 20 | 0 |

The disassembly force is approximately zero upon returning to a temperature below the transition temperature after cycling above the transition temperature.

Although illustrated and described above with reference to certain specific embodiments, the present invention is nevertheless not intended to be limited to the details shown. Rather, various modifications may be made in the derails within the scope and range of equivalents of the claims and without departing from the spirit of the invention.

What is claimed is:

1. A process for assembling semiconductor modules each having a cover attached with a bonding agent, said process comprising:
   a) loading at room temperature said semiconductor modules into an assembly fixture with one of a leaf and a coil shape memory alloy spring over each cover;
   b) placing the fixture and modules into a heating chamber;
   c) heating the fixture and modules in the heating chamber to a temperature sufficient for bonding said bonding agent and above a transition temperature range of said shape memory alloy spring so that said spring exerts an elevated force on said module; and
   d) cooling said fixture and modules to a lower temperature below said transition temperature range so that said spring exerts a lesser amount of force on said module, and disengaging said springs at said lower temperature.

2. The process according to claim 1, wherein said heating step (c) comprises exceeding said transit on temperature range such that said spring exerts said elevated force before the bonding agent significantly sets.

3. The process according to claim 1, wherein disengaging the springs in step (d) comprises removing the springs.

4. A fixture for assembly of a semiconductor module comprising a substrate and a cover, the fixture comprising:
   a baseplate having alignment features adapted to accept the substrate; and
   a spring-loading device located over the baseplate and comprising one of a leaf and a coil shape memory alloy spring engaging the cover, wherein the shape memory alloy spring has a variable resistance to deformation as a function of temperature and the resistance to deformation is greater at a temperature above a transition temperature range than the resistance to deformation at a temperature below the transition temperature range, and further wherein the cover is adapted to be attached to a chip with a bonding agent having a cure temperature, wherein the shape memory alloy spring transition temperature range is below the cure temperature.

5. The fixture according to claim 4, wherein said cover is attached to said substrate, and wherein the shape memory alloy spring transition temperature range is above room temperature.

6. The fixture according to claim 5, wherein the transition temperature range is about 30° to about 40° C.

7. The fixture according to claim 5, wherein the bonding agent is a solder having a reflow temperature and the cure temperature is the solder reflow temperature.

8. The fixture according to claim 7, wherein the transition temperature range is between at least about 10° C. above room temperature and at least about 10° C. below the solder reflow temperature.

9. The fixture according to claim 5, wherein the resistance to deformation at a temperature below said transition temperature range is low enough that said spring may be easily deformed by hand, yet high enough to hold the module within the fixture, and wherein the resistance to deformation at a temperature above the transition temperature range is high enough to promote high product yield but not high enough to damage components of the module or fixture.

10. The fixture according to claim 9, wherein the resistance to deformation at a temperature above the transition temperature range is greater than about 5 pounds.

11. The fixture according to claim 4, further comprising a spreader plate between said shape memory alloy spring and said cover.

12. The fixture according to claim 4, further comprising an alignment plate located on top of the baseplate and adapted to align the cover over the substrate.

13. The fixture according to claim 4, wherein said shape memory alloy spring is a leaf spring.

14. The fixture according to claim 4, wherein said shape memory alloy spring is a coil spring.

15. The fixture according to claim 14, wherein said coil spring is released by an actuating cam.

16. A fixture for assembly of a plurality of semiconductor modules, each module comprising a substrate and a cover, the fixture comprising:
   a baseplate;
   a removable tray located on said baseplate and having a plurality of cavities each adapted to accept a substrate;
   an alignment plate removably located on top of said tray, said alignment plate having a plurality of openings each adapted to fit a cover;
   a compression plate pivotably attached to said baseplate and pivoting between an open position and a closed pressure-applying position; and one or more shape memory springs, selected from the group consisting of leaf and coil springs, each interposed between said compression plate and at least one of said plurality of module covers; wherein the shape memory alloy spring has a transition temperature range and a variable resistance to deformation, wherein the resistance to deformation at a temperature above the transition temperature range is greater than the resistance to deformation at a temperature below the transition temperature range, and further wherein the cover is adapted to be attached to a chip with a bonding agent having a cure temperature, wherein the shape memory alloy spring transition temperature range is below the cure temperature.

17. The fixture of claim 16 further comprising one or more shape memory springs interposed between said compression plate and said alignment plate.

18. The fixture of claim 16 further comprising at least one spreader plate interposed between said springs and said module covers.

\* \* \* \* \*